US011205715B2

(12) United States Patent
Armstrong et al.

(10) Patent No.: US 11,205,715 B2
(45) Date of Patent: Dec. 21, 2021

(54) SELF-ALIGNED NANOWIRE

(71) Applicant: Intel Corporation, Santa Clara, CA (US)

(72) Inventors: Mark Armstrong, Portland, OR (US); Biswajeet Guha, Hillsboro, OR (US); Jun Sung Kang, Portland, OR (US); Bruce Beattie, Portland, OR (US); Tahir Ghani, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/632,856

(22) PCT Filed: Aug. 21, 2017

(86) PCT No.: PCT/US2017/047758
§ 371 (c)(1),
(2) Date: Jan. 21, 2020

(87) PCT Pub. No.: WO2019/040041
PCT Pub. Date: Feb. 28, 2019

(65) Prior Publication Data
US 2020/0152767 A1 May 14, 2020

(51) Int. Cl.
*H01L 29/66* (2006.01)
*H01L 21/265* (2006.01)
(Continued)

(52) U.S. Cl.
CPC ........ *H01L 29/6681* (2013.01); *H01L 21/266* (2013.01); *H01L 21/26506* (2013.01);
(Continued)

(58) Field of Classification Search
CPC .......... H01L 29/6681; H01L 21/26506; H01L 21/266; H01L 21/30604; H01L 29/0673; H01L 29/66439; B82Y 10/00
See application file for complete search history.

(56) References Cited

U.S. PATENT DOCUMENTS 9,755,034 B2 9/2017 Kim et al.
2014/0264280 A1* 9/2014 Kim .................. H01L 29/66545
257/29
(Continued)

FOREIGN PATENT DOCUMENTS

KR 20170049327 5/2017
TW 201618309 A 5/2016
TW 201717397 A 5/2017

OTHER PUBLICATIONS

International Preliminary Report on Patentability from PCT/US2017/047758 dated Mar. 5, 2020, 10 pgs.
(Continued)

*Primary Examiner* — Changhyun Yi
(74) *Attorney, Agent, or Firm* — Finch & Maloney PLLC

(57) ABSTRACT

A method comprising: forming a substrate; forming a first nanowire over the substrate; forming a second nanowire over the substrate; forming a gate over a portion of the first and second nanowires; implanting a dopant such that a region between the first and second nanowires under the gate does not receive the dopant while a region between the first and second nanowires away from the gate receives the dopant, wherein the dopant amorphize a material of the region between the first and second nanowires away from the gate; and isotopically etching of the region between the first and second nanowires away from the gate.

19 Claims, 8 Drawing Sheets

(51) Int. Cl.
  *H01L 21/266* (2006.01)
  *H01L 21/306* (2006.01)
  *H01L 29/06* (2006.01)
  *H01L 29/423* (2006.01)
  *H01L 29/78* (2006.01)

(52) U.S. Cl.
  CPC .... *H01L 21/30604* (2013.01); *H01L 29/0653* (2013.01); *H01L 29/0673* (2013.01); *H01L 29/42392* (2013.01); *H01L 29/6653* (2013.01); *H01L 29/66545* (2013.01); *H01L 29/66553* (2013.01); *H01L 29/7853* (2013.01)

(56) References Cited

U.S. PATENT DOCUMENTS

| | | | |
|---|---|---|---|
| 2015/0348848 A1 | 12/2015 | Fu et al. | |
| 2017/0047452 A1 | 2/2017 | Kim et al. | |
| 2017/0053998 A1 | 2/2017 | Kim et al. | |
| 2017/0194510 A1 | 7/2017 | Doris et al. | |
| 2017/0221708 A1* | 8/2017 | Bergendahl | H01L 29/16 |

OTHER PUBLICATIONS

International Search Report and Written Opinion from PCT/US2017/047758 dated Feb. 26, 2018, 13 pgs.

1st Office Action in Primary Examination issued by the Examiner of the Intellectual Property Office (IPO) for Taiwan Patent Application No. 107124222, dated Sep. 3, 2021, 13 pages.(including 6 pages English translation).

* cited by examiner

SELF-ALIGNED NANOWIRE

BACKGROUND

Planar and Fin based silicon Complementary Metal Oxide Semiconductor (CMOS) technology is currently used for fabricating microelectronics. However, Moore's Law has turned the focus on nano-wire device technology. MOS technologies in this medium are considered immature from a high volume manufacturing (HVM) perspective. For example, current etching technologies result in unaligned spacers that are adjacent to nanowires, and these unaligned spacers impact performance and yield of nanowire devices.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
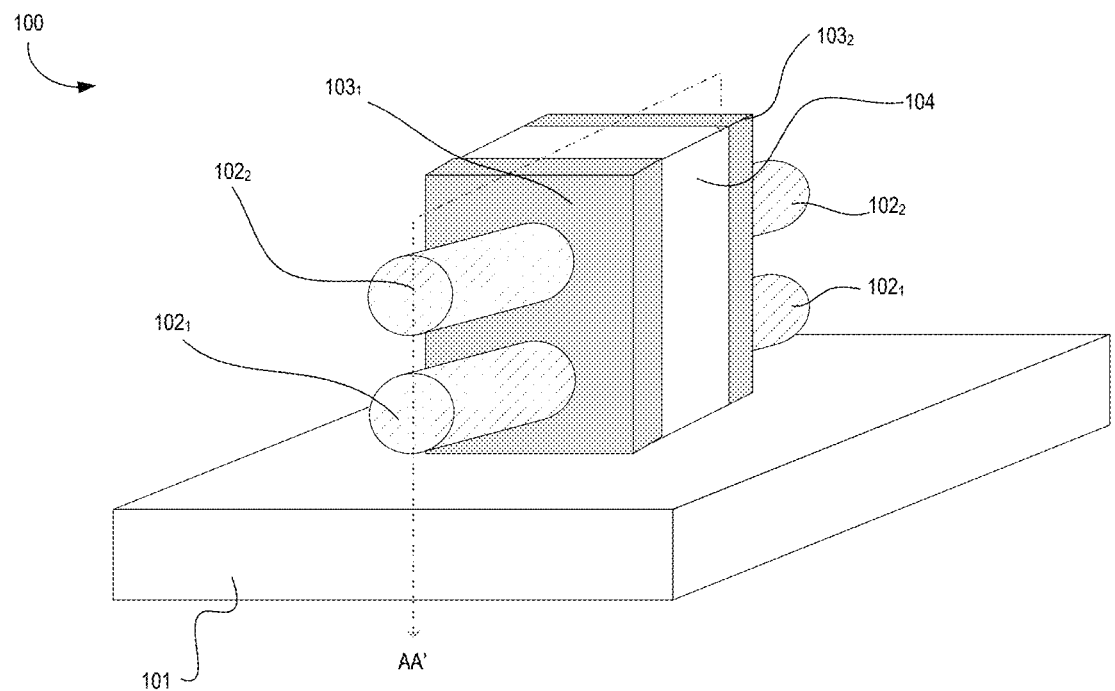
FIG. 1 illustrates a three dimensional (3D) view of a nanowire device formed by uniform etching of sacrificial layers, in accordance with some embodiments.

Some embodiments describe a method for forming self-aligned cavity spacer and wire release integration schemes, which reduce etch variability in nanowire or nanoribbon transistors. In some embodiments, an implant is done which increases etch rate of a sacrificial layer only in the implanted areas. In some embodiments, the sacrificial layer removal is aligned across all the nanowires or nanoribbons in a stack. In some embodiments, the buried spacer can be precisely aligned to a gate edge, allowing for increased drive and reduced parasitic capacitance. In some embodiments, the etch time margin during nanowire release etch is improved. As such, performance and yield of nanowire/nanoribbon is improved. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For the purposes of present disclosure the terms "spin" and "magnetic moment" are used equivalently. More rigorously, the direction of the spin is opposite to that of the magnetic moment, and the charge of the particle is negative (such as in the case of electron).

FIG. 1 illustrates a 3D view of a nanowire device 100 formed by uniform etching of sacrificial layers, in accordance with some embodiments. The 3D view of FIG. 1 is a simplified figure that shows a stack of two nanowires with all-around gate formed on a substrate. In this example, nanowire device 100 comprises substrate 101, nanowires $102_{1-2}$, spacers $103_{1-2}$, gate 104.

In some embodiments, substrate 101 includes a silicon support substrate, upon which a buffer layer is epitaxially grown. In some embodiments, the support substrate may also be of alternate materials, which may or may not be combined with silicon, including, but not limited to, germanium, indium antimonide, lead telluride, indium arsenide, indium phosphide, gallium nitride, gallium arsenide, or gallium antimonide, carbon (SiC), and sapphire. In some embodiments, substrate 101 includes a dielectric layer such as a buried oxide (BoX) which may be formed by transferring one or more layers of the semiconductor from which the nanowires are formed onto the substrate 101.

In some embodiments, nanowires $102_{1-2}$ are crystalline with much greater long-range order than a polycrystalline material. In some embodiments, channel regions formed by the nanowires are substantially a single crystalline. A person skilled in the art would appreciate that while single crystalline nanowires may be referred to as monocrystalline, a low level of crystal defects may nevertheless be present as artifacts of an imperfect epitaxial growth process.

In some embodiments, nanowires $102_{1-2}$ include one or more of: Si, Ge, Ga, As, In, N, or P. In some embodiments, nanowires $102_{1-2}$ are n-type nanowires or p-type nanowires. In some embodiments, when nanowires $102_{1-2}$ are p-type nanowires they comprise germanium (Ge). Germanium has high hole mobility and lattice parameters that are sufficiently matched to some group III-V semiconductor materials for good quality epitaxial stacks of Ge layers and group III-V semiconductor layers. In some embodiments, p-type nanowire $102_{1-2}$ are composed of a group IV alloy (e.g., SiGe) or composed of silicon.

In some embodiments, when nanowires $102_{1-2}$ are n-type nanowires they are comprised of a group III-V semiconductor material. In some embodiments, when a p-type nanowire comprises of germanium, the n-type nanowire comprises of GaAs. In some embodiments, the n-type nanowires $102_{1-2}$ include one or more of: InAs, a group III-N (e.g., GaN), InP, a ternary alloy comprising GaAs, a ternary alloy comprising InAs, a ternary alloy comprising InP, or a ternary alloy comprising a group III-N, or a quaternary alloy comprising GaAs, a quaternary alloy comprising InAs, a quaternary alloy comprising InP, or a quaternary alloy comprising a group III-N. In some embodiments, the channel regions in both the p-type nanowire and n-type nanowires are substantially undoped for highest carrier mobility. For simplicity, two nanowires are shown in a stack. However, in some embodiments, more than two nanowires can be fabricated in a stack, and in some embodiments, multiple stacks can be formed in parallel for the same nanowire device (or transistor).

For simplicity, source and drain regions are not shown. However, a person skilled in the art would appreciate that source and drain regions are formed on either side of spacers $103_{1-2}$. In some embodiments, the source regions (not shown) comprise the same semiconductor material present in the channel region for the respective p-type and n-type nanowires, but the source and drain regions further include a higher concentration of dopant. In some embodiments, the p-type nanowire source/drain region comprises a high p-type impurity (e.g., P+ dopant) while the n-type nanowire source/drain region comprises a high n-type impurity (e.g., N+ dopant). In some embodiments, the source and drain regions maintain the same mono-crystallinity as within the channel region of the nanowires $102_{1-2}$. In some embodiments, at least one of the source/drains are contacted with an ohmic metal (not shown) that coaxially wraps completely around the nanowires $102_{1-2}$ to fill in the gaps between the nanowires and the substrate 101. The source/drain contacts may further include an epitaxially grown semiconductor of different composition than the nanowires $102_{1-2}$. For example, a tunnel junction (e.g., a p+ layer wrapping around the source region of the nanowire) may provide an ultra-steep turn on and off (e.g., improved sub-threshold performance). As another example, in-situ doped semiconductor may be grown completely around the released source/drains for lower contact resistance.

In some embodiments, spacers $103_{1-2}$ are low-K dielectrics. Low-K dielectrics are materials with dielectric constants that are smaller than dielectric constants of Silicon Dioxide ($SiO_2$). In some embodiments, material for spacers $103_{1-2}$ include one or more of fluorine-doped silicon dioxide, carbon-doped silicon dioxide, porous silicon dioxide, porous carbon-doped silicon dioxide, spin-on organic polymeric dielectrics (e.g., polyimide, polynorbornenes, benzocyclobutene, PTFE, etc.), or spin-on silicon polymeric dielectrics (e.g., hydrogen silsesquioxane, methylsilsesquioxane, etc.).

In some embodiments, gate 104 comprises one or more of: Gd, O, Hf, Si, Ta, Al, Ti, W, or N. In various embodiments, gate 104 comprises gate conductors and dielectrics that wrap around nanowires $102_{1-2}$. In some embodiments, gate conductors are electrically isolated from nanowires $102_{1-2}$ by a gate dielectric material. In some embodiments, the gate dielectric material may include one or more of any material known in the art to be suitable for FET gate dielectrics (and/or channel passivation) and is preferably a high-K dielectric (e.g., having a dielectric constant greater than that of silicon nitride ($Si_3N_4$)), such as, but not limited to, high-K oxides such as gadolinium oxide ($Gd_2O_3$), hafnium oxide ($HfO_2$), high-K silicates such as HfSiO, TaSiO, AlSiO, and high-K nitrides such as HfON.

In some embodiments, the gate conductor may be of any material known in the art for gate electrodes suitable for the particular nanowire semiconductor composition and desired threshold voltage and operative mode (e.g., enhancement or depletion). In some embodiments, the same gate dielectric material is employed for the p-type gate dielectric and the n-type gate dielectric. In some embodiments, the gate conductor composition includes a work function metal which may be selected to be distinct for each of the p-type gate conductor and the n-type gate conductor to obtain a desired threshold voltage ($V_t$) (e.g., greater than 0 V, etc.). In some embodiments, the conductive gate materials include one or more of: tungsten (W), aluminum (Al), titanium (Ti), tantalum(Ta), nickel (Ni), molybdenum (Mo), germanium (Ge), platinum (Pt), gold (Au), ruthenium (Ru), palladium (Pd), iridium (Ir), their alloys and silicides, carbides, nitrides, phosphides, and carbonitrides thereof.

In some embodiments, self-aligned cavity spacers $103_{1-2}$ are formed using an etching scheme that reduces etch variability in nanowire or nanoribbon transistors. In some embodiments, an implant is done which increases the etch rate of a sacrificial layer only in the implanted areas. In some embodiments, the sacrificial layer removal is aligned across all the nanowires or nanoribbons in a stack. In some embodiments, the etch time margin during nanowire release etch is improved. As such, performance and yield of nanowire/nanoribbon is improved.

Figure 2:
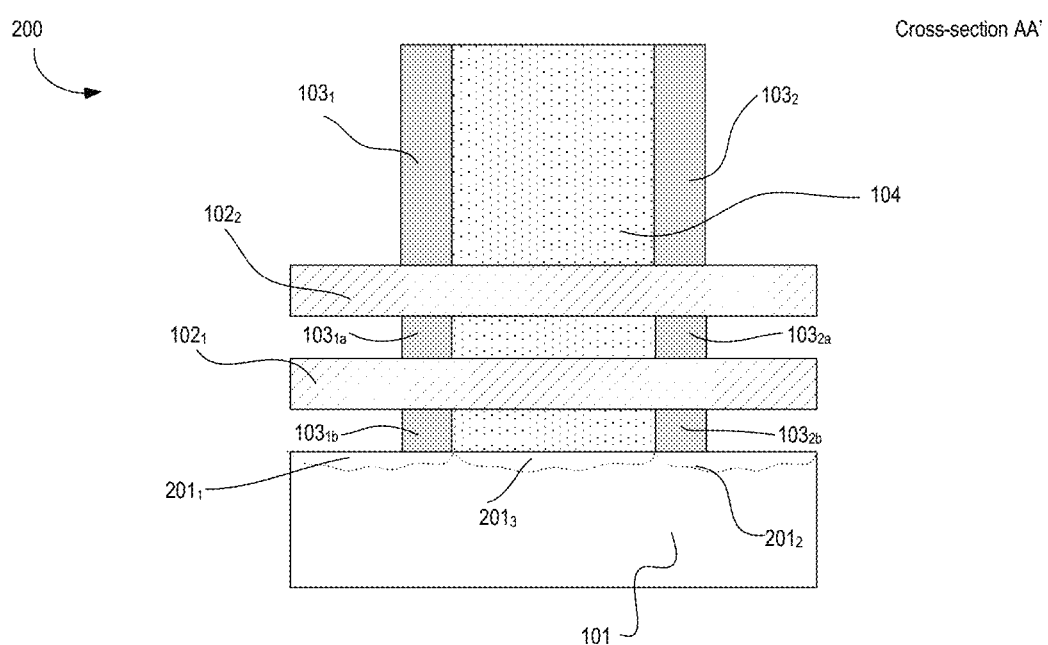
FIG. 2 illustrates a cross-section of the nanowire device of FIG. 1, in accordance with some embodiments.
Figure 3A:
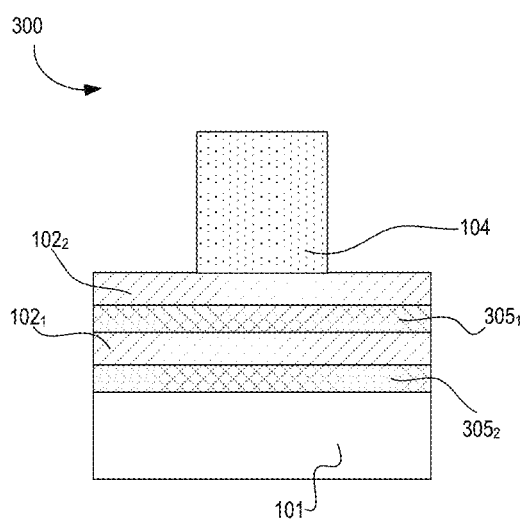
FIGS. 3A-J illustrate cross-sections showing formation of a nanowire device using a fast uniform etching technique, in accordance with some embodiments of the disclosure.
Figure 3B:
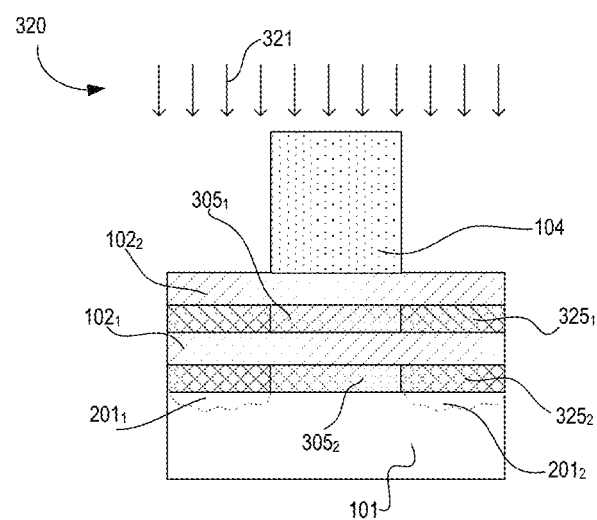
Figures 3C, 3D:
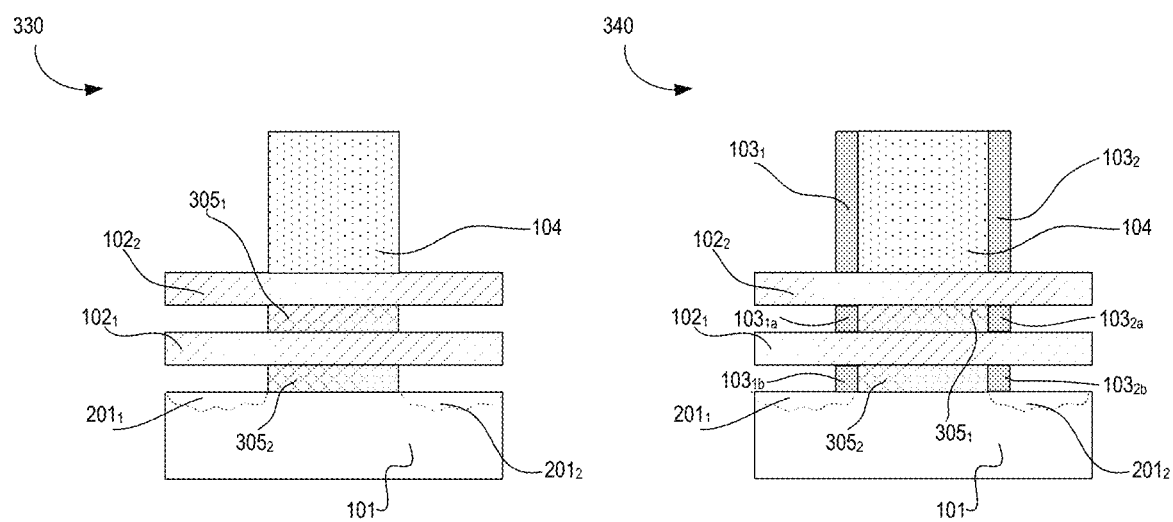
Figures 3E, 3F:
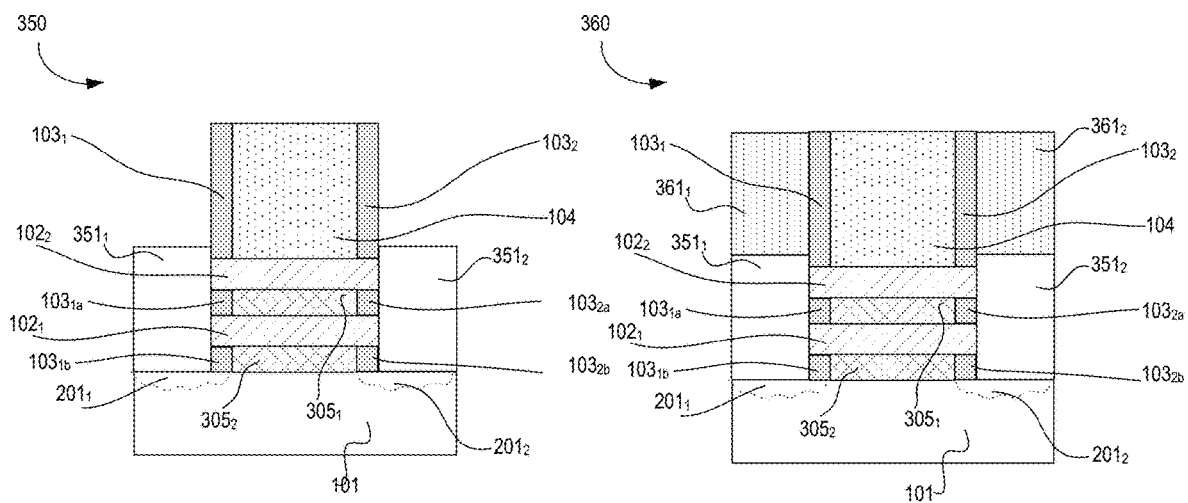
Figure 3G:
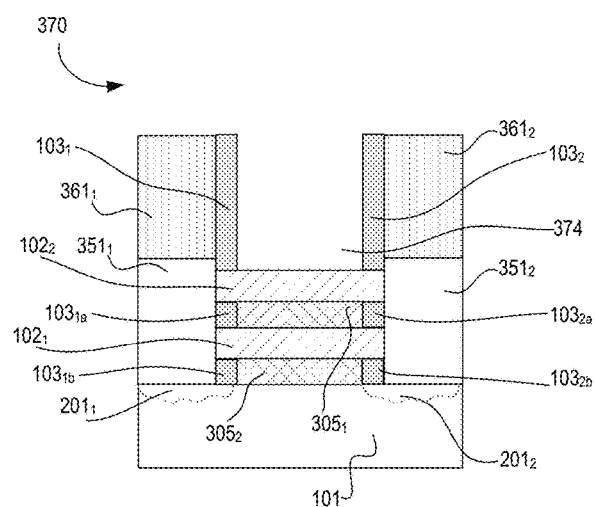
Figure 3H:
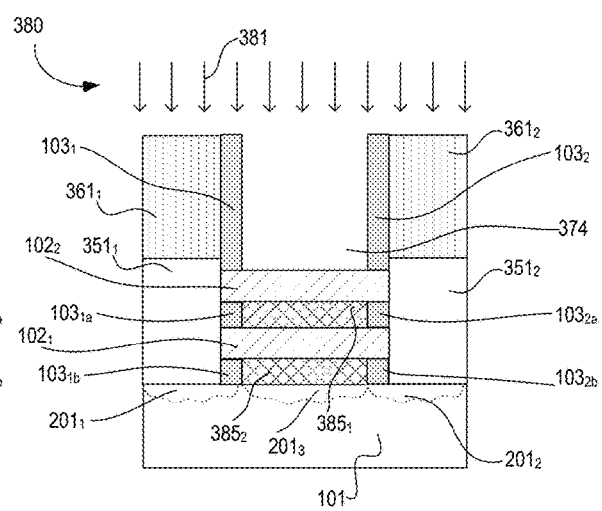
Figures 3I, 3J:
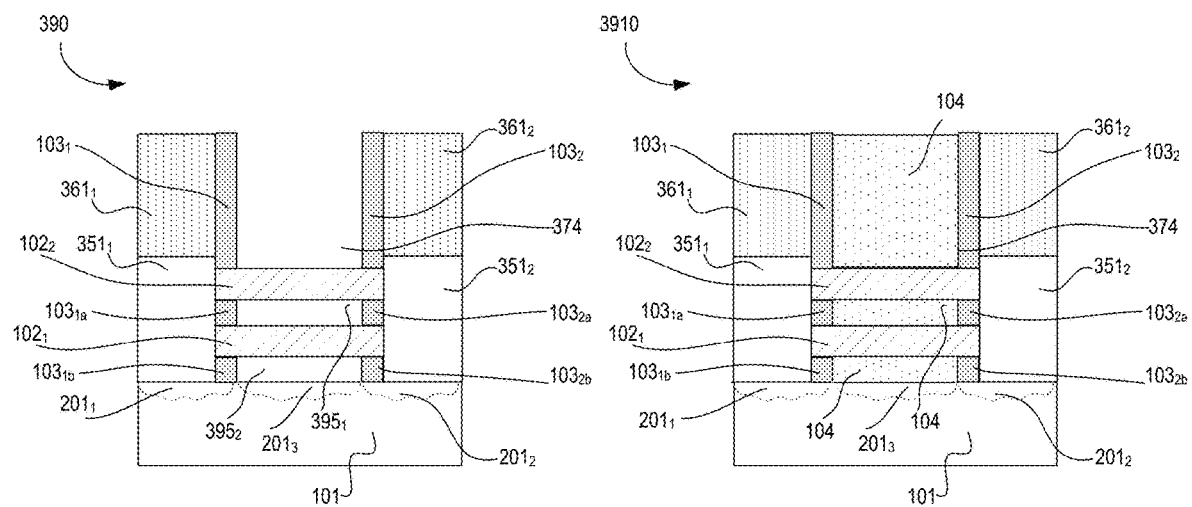

FIG. 2 illustrates cross-section AA' 200 of the nanowire device of FIG. 1, in accordance with some embodiments. It is pointed out that those elements of FIG. 2 having the same reference numbers (or names) as the elements of any other figure can operate or function in any manner similar to that described, but are not limited to such. Cross-section AA' illustrates spacers $103_1$, $103_{1a}$, and $103_{1b}$ on the other side of gate 104, and spacers $103_2$, $103_{2a}$, and $103_{2b}$ on the other side of gate 104. Here, regions $201_{1-3}$ in substrate 101 illustrate regions where evidence may exist of implants to amorphize sacrificial layer regions around nanowires $102_{1-2}$. Here the term "amorphize" generally refers both to fully destroy the crystal structure of an implanted material, as well as to merely heavily damage a crystal structure in such a way that etch rate is increased. In some embodiments, when Si is used to amorphize SiGe in specific regions around nanowires $102_{1-2}$, this silicon implant ends up modifying crystals of Si substrate 104 in regions $201_{1-3}$. The modification is obvious when Si crystals in regions $201_{1-3}$ are compared with the rest of the crystals in silicon substrate 104. In some embodiments, when Ge, Xe or Ar is used to amorphize SiGe in specific regions around nanowires $102_{1-2}$, this Ge, Xe or Ar implant ends up in Si substrate 104 in regions $201_{1-3}$.

In some embodiments, the self-aligned nanowire fabrication process results in the spacers being aligned with one another that improves yield of the nanowire device. For example, side walls of spacers $103_1$, $103_{1a}$, and $103_{1b}$ are aligned with one another, and side walls of spacers $103_2$, $103_{2a}$, and $103_{2b}$ are aligned with one another. In some embodiments, the buried spacers (e.g., $103_{1a}$, $103_{1b}$, $103_{2a}$, and $103_{2b}$) are precisely aligned to the edge of gate 104, allowing for increased drive and reduced parasitic capacitance.

In some embodiments, a first nanowire $102_2$ is over substrate 101, wherein the first nanowire $102_2$ has a length extending along a plane of substrate 101, wherein first and second sides of the first nanowire $102_2$ are on first and second edges, respectively, along the length of the first nanowire $102_2$. For example, the length of first nanowire $102_2$ extends from left to right in FIG. 2, and where the endings of the first nanowire $102_2$ to the left and right are the first and second edges of the first nanowire $102_2$. In some embodiments, a first pair of spacers (e.g., $103_{1a}$ and $103_{2a}$) are provided comprising a first spacer $103_{1a}$ adjacent to the first side of the first nanowire $102_2$, and a second spacer $103_{2a}$ adjacent to the second side of the first nanowire $102_2$.

In some embodiments, a second nanowire $102_1$ is disposed over substrate 101, wherein the second nanowire $102_1$ has a length extending along a plane of substrate 101, wherein first and second sides of the second nanowire $102_1$ are on first and second edges, respectively, along the length of the second nanowire $102_1$. For example, the length of second nanowire $102_1$ extends from left to right in FIG. 2, and where the endings of the second nanowire $102_1$ to the left and right are the first and second edges of the second nanowire $102_1$. In some embodiments, a second pair of spacers (e.g., $103_{1b}$ and $103_{2b}$) comprising a first spacer $103_{1b}$ adjacent to the first side of the second nanowire $102_1$ and to the substrate, and a second spacer adjacent to the second side of the second nanowire $102_1$ and to substrate 101. In some embodiments, the edges of the first spacer $103_{1a}$ of the first nanowire $102_2$ is directly aligned over edges of the first spacer $103_{1b}$ of the second nanowire $102_1$, and wherein edges of the second spacer $103_{2a}$ of the first nanowire $102_2$ is directly aligned over edges of the second spacer $103_{2b}$ of the second nanowire $102_1$.

Here, gate region 104 is disposed over the first nanowire $101_2$ and second nanowires $102_1$. In some embodiments, a third pair of spacers (e.g., $103_{1-2}$) is provided comprising a first spacer $103_1$ adjacent to a first side of the gate region 104, and a second spacer $103_2$ adjacent to a second side of the gate region 104, wherein edges of the first spacer $103_1$ of the gate region 104 is directly aligned over edges of the first spacers $103_{1a}$ and $103_{1b}$ of the first nanowire $102_2$ and second nanowire $102_1$, respectively. In some embodiments, the edges of second spacer $103_2$ of the gate region 104 is directly aligned over edges of the second spacers $103_{2a}$ and $103_{2b}$ of the first nanowire $102_2$ and second nanowire $102_1$.

In some embodiments, a source region (not shown) is provided which is adjacent to the first spacer $103_1$ of the third pair of spacers $103_{1-2}$. For example, a source contact coupled to the source region is separated by spacer $103_1$ and another insulator. In some embodiments, a drain region (not shown) adjacent to the second spacer $103_2$ of the third pair of spacers $103_{1-2}$. In some embodiments, crystal structure of the substrate 101 directly under the second nanowire $102_1$ is different from crystal structure of the substrate 101 near a backend. For example, the crystal structure of the substrate 101 near regions $201_{1-3}$ is damaged or has traces of other implants (e.g., Ge) than the crystal structure of the substrate 101 near the bottom edge of substrate 101 (which is near a backend of a die). In some embodiments, the substrate 101 directly under the second nanowire $101_2$ includes traces of Ge or Ar, and wherein the substrate 101 near a backend includes silicon only. For example, when Ge or Ar is used as an implant to amorphize sacrificial layers for etching, then traces of Ge or Ar can be found in regions $201_{1-3}$.

In some embodiments, a first region (e.g., a first epitaxy over-layer) is provided which is adjacent to the source region and the substrate 101, and wherein the first region is directly adjacent to the first spacers of the first, second, and third pair of spacers (e.g., $103_{1b}$, $103_{1a}$, and $103_1$, respectively). In some embodiments, the first region (not shown here, but shown in FIGS. 3E-J as $351_1$) comprises one or more of: Si, P, B, Ge, C, In, Ga, As, or N. Referring back to FIG. 2, in some embodiments, a second region (e.g., a second epitaxy over-layer) is provided adjacent to the drain region and the substrate 101, and wherein the second region is directly adjacent to the second spacers of the first, second, and third pair of spacers (e.g., $103_{2b}$, $103_{2a}$, and $103_2$, respectively). In some embodiments, the second region (not shown here, but shown in FIGS. 3E-J as $351_2$) comprises one or more of: Si, P, B, Ge, C, In, Ga, As, or N. In some embodiments, before gate material 104 is deposited around the nanowires $101_{1-2}$, the region separating the nanowires $101_{1-2}$ comprises one or more of: Gd, O, Hf, Si, Ge, Ta, Al, or N. This region is the sacrificial region which is then etched out using the process described with reference to various embodiments.

FIGS. 3A-J illustrate cross-sections 300, 320, 330, 340, 350, 360, 370, 380, 390, and 3910, respectively, showing formation of a nanowire device using a fast uniform etching technique, in accordance with some embodiments of the disclosure. It is pointed out that those elements of FIGS. 3A-J having the same reference numbers (or names) as the elements of any other figure can operate or function in any manner similar to that described, but are not limited to such.

Cross-section 300 shows a stack of layers that are already formed using known processes. These layers include substrate 101, nanowires $102_{1-2}$, sacrificial layers $305_{1-2}$ between the nanowires $102_{1-2}$, and gate 104. In various embodiments, the sacrificial layers $305_{1-2}$ include one or more of: Si, Ge, In, Al, Ga, As, N, or P. In some embodiments, sacrificial layers $305_{1-2}$ are used for forming gate regions around nanowires $102_{1-2}$. In various embodiments, sacrificial layers $305_{1-2}$ are etched out using any known isotropic etching techniques.

Cross-section 320 shows the stack of layers after an implant 321 is applied to the stack. In various embodiments, implant 321 amorphizes SiGe of the sacrificial layers $305_{1-2}$. In some embodiments, implant 321 also reaches substrate 101 and this implant causes the crystal structure of Si adjacent to SiGe sacrificial layers $305_{1-2}$ to be modified compared to crystal structure of Si of the rest of substrate 101. Here, the regions adjacent to SiGe sacrificial layers $305_2$ is shown by dotted regions $201_{1-2}$. The implant conditions are chosen such that the implant is substantially blocked by the gate material, in accordance with some embodiments. The implant is shown vertically oriented in the figure but may in fact be tilted to achieve a desired implant profile, in accordance with some embodiments. The implant 321 changes the crystallinity of the exposed area, and as such assists with speeding the etch rate of the exposed area. After implant 321 changes the crystallinity of the exposed area, sacrificial layers $305_{1-2}$ becomes sacrificial layers $325_{1-2}$.

One reason for SiGe to be more susceptible to damage or change in crystallinity due to implant 321 is that SiGe has a weaker crystal than, for example, Si. In various embodiments, gate 104 protects the layers immediately underneath it to be protected from implant 321. Any known implant deposition process can be used. In some embodiments, implant 321 is one of Si, Ge, Xe, As, or Ar. In some embodiments, implant 321 is applied at high temperature in the range of 30 degrees Celsius to 150 degrees Celsius. A person skilled in the art would appreciate that hot implants are typically not done because they result in lower throughput. Various embodiments use hot implant process to damage or change crystallinity of sacrificial layers $305_{1-2}$ (which then becomes sacrificial layers $325_{1-2}$) to reduce etch time.

Cross-section 330 shows the stack of layers after isotropic etching of sacrificial layers $325_{1-2}$. In some embodiments, after damage or change in crystallinity of sacrificial layers $305_{1-2}$ (which then becomes sacrificial layers $325_{1-2}$), it becomes easy for isotropic etching of sacrificial layers $325_{1-2}$. For example, the amorphized sacrificial layers $325_{1-2}$ can be etched in a much faster and cleaner manner without causing damage to surrounding layers. The isotropic etching of sacrificial layers $325_{1-2}$ results in vertically aligned edges of SiGe under gate 104 and nanowires $102_{1-2}$, in accordance with some embodiments.

Cross-section 340 shows the stack of layers after spacers are deposited on $103_{1-2}$, $103_{1a}$, $103_{1b}$, $103_{2a}$, or $103_{2b}$. The process of depositing and shaping spacers $103_{1-2}$, $103_{1a}$, $103_{1b}$, $103_{2a}$, or $103_{2b}$ is well known. These spacers are also referred to as buried spacers that are aligned to gate 103 for improved performance and yield of the nanowire device. However, by providing vertically aligned edges of SiGe under gate 104 and nanowires $102_{1-2}$, using the etching process of some embodiments, results in the sides of spacers adjacent to SiGe under gate 104 to cleanly abut with one another.

Cross-section 350 shows the stack of layers after epitaxy (EPI) that results in deposition of crystalline over-layers $351_{1-2}$ on either sides of spacers $103_{1-2}$, $103_{1a}$, $103_{1b}$, $103_{2a}$, or $103_{2b}$. These crystalline over-layers $351_{1-2}$ are also referred to as EPI layers. In this example, the EPI layers $351_{1-2}$ extend vertically to the lower region of spacers $103_{1-2}$. Any known method of growing the EPI layers $351_{1-2}$ can be used. In some embodiments, EPI layers $351_{1-2}$ comprise one or more of Si, SiGe, Si carbide, InGaAs, or other III-V group materials.

Cross-section 360 shows the stack of layers after contact metal $361_{1-2}$ is deposited. In some embodiments, after the surface of the EPI layers $351_{1-2}$ is polished, contact metal $361_{1-2}$ is deposited. In some embodiments, contact metal $361_{1-2}$ comprises any known metal such as W, Al, Cu, Graphene, Co, etc.

Cross-section 370 shows the stack of layers after gate 104 is etched out between spacers $103_{1-2}$. Any known anisotropic etching process can be used for etching out gate 104. In some embodiments, a hard metal of some sort is deposited between nanowire $102_2$ and gate 104 to assist with etch stop. Other techniques for stopping the etch process can also be used.

Cross-section 380 illustrates the process of implanting material 381 (which can be the same material as 321) to amorphize SiGe of the sacrificial layers $305_{1-2}$. In some embodiments, implant 381 also reaches substrate 101 and this implant causes the crystal structure of Si adjacent to SiGe sacrificial layers $305_{1-2}$ to be modified compared to crystal structure of Si of the rest of substrate 101. Here, the region adjacent to SiGe sacrificial layers $305_2$ is shown by dotted region $201_3$. The implant 381 changes the crystallinity of the exposed area, and as such assists with speeding the etch rate of the exposed area. After implant 381 changes the crystallinity of the exposed area, sacrificial layers $305_{1-2}$ become sacrificial layers $385_{1-2}$. In some embodiments, when Ge is used as implant material 381, residue of Ge can be traced in region $201_3$ of substrate 101.

Cross-section 390 shows the stack of layers after isotropic etching of sacrificial layers $385_{1-2}$. In some embodiments, after damage or change in crystallinity of sacrificial layers $305_{1-2}$ (which then becomes sacrificial layers $385_{1-2}$), it becomes easy for isotropic etching of sacrificial layers $385_{1-2}$. The isotropic etching of sacrificial layers $385_{1-2}$ results in clean edges of SiGe around nanowires $102_{1-2}$ and buried spacers $103_{1a}$, $103_{1b}$, $103_{2a}$, and $103_{2b}$. Compared to prior art methods of etching SiGe between spacers $103_{1a}$, $103_{1b}$, $103_{2a}$, and $103_{2b}$, no damage is done to Epi layers $351_{1-2}$, which remain untouched. The effectiveness of isotropic etching of sacrificial layers $385_{1-2}$ is vastly improved over prior methods because the crystallinity of SiGe of layers $385_{1-2}$ is damaged without damaging buried spacers $103_{1a}$, $103_{1b}$, $103_{2a}$, and $103_{2b}$. As such, all spacers that are adjacent to the nanowires preserve their integrity and are perfectly or near perfectly aligned to one another. Further, over etch margin increases and etch-out is avoided.

Cross-section 3910 illustrates the stack of layers after gate material 104 is deposited. The gate material wraps around nanowires $102_{1-2}$ forming a coaxial type nanowire structure. Due to the clean and efficient etching of the sacrificial layers $305_{1-2}$, from the various embodiments, gate material uniformly deposits around nanowires $102_{1-2}$ to improve device performance and yield.

Figure 4:
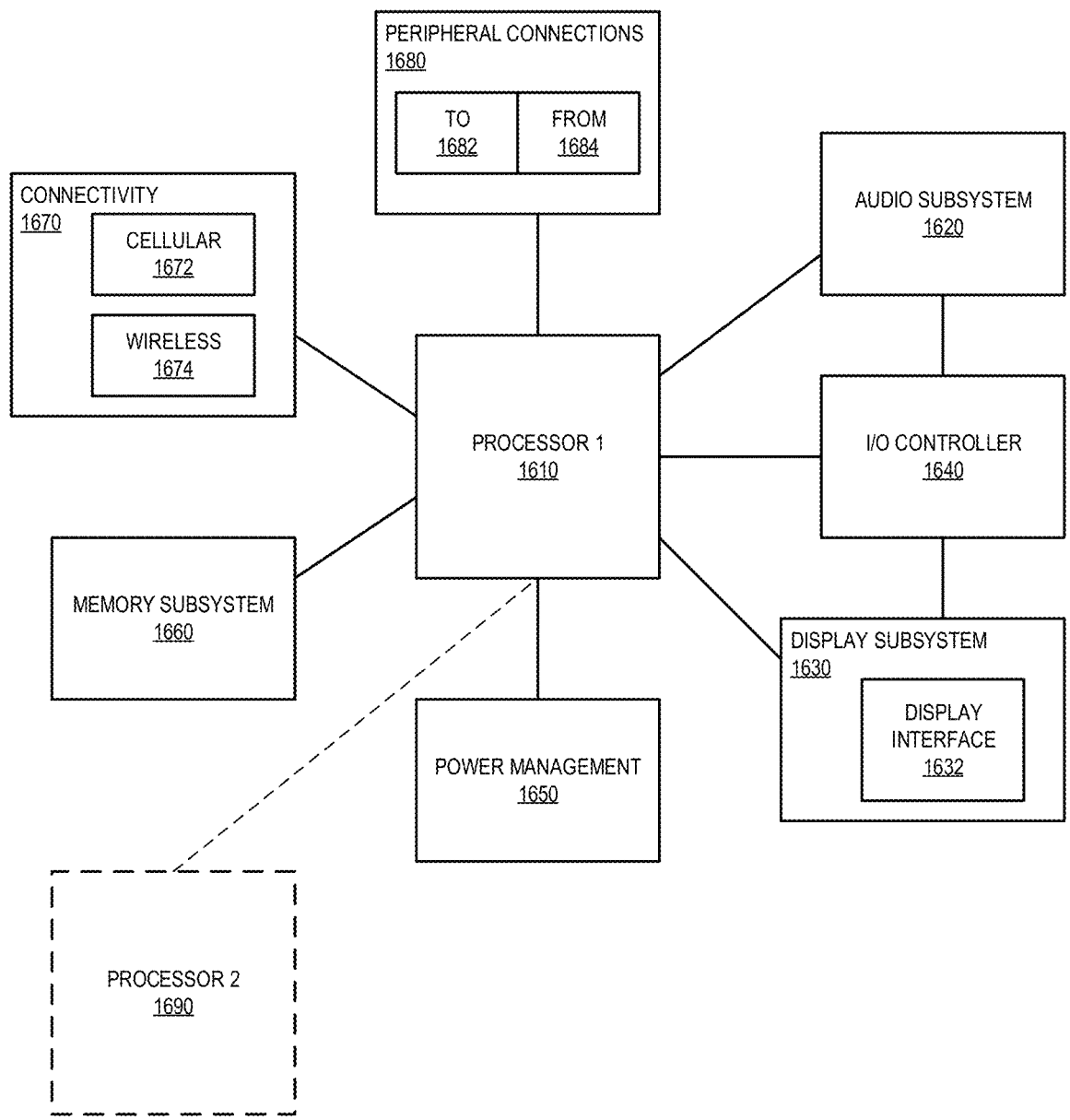
FIG. 4 illustrates a smart device or a computer system or a SoC (System-on-Chip) having nanowire devices formed by the etching mechanism of various embodiments, according to some embodiments of the disclosure.

FIG. 4 illustrates a smart device or a computer system or a SoC (System-on-Chip) having nanowire devices formed by the etching mechanism of various embodiments, according to some embodiments of the disclosure. It is pointed out that those elements of FIG. 4 having the same reference numbers (or names) as the elements of any other figure can operate or function in any manner similar to that described, but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, nanowire, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 4 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 having nanowire devices formed by the etching mechanism of various embodiments, according to some embodiments discussed. Other blocks of the computing device 1600 may also include nanowire devices formed by the etching mechanism of various embodiments, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1. An apparatus comprising: a substrate comprising silicon; a first nanowire over the substrate, wherein the first nanowire has a length extending along a plane of the substrate, wherein first and second sides of the first nanowire are on first and second edges, respectively, along the length of the first nanowire; a first pair of spacers comprising a first spacer adjacent to the first side of the first nanowire, and a second spacer adjacent to the second side of the first nanowire; a second nanowire disposed over the substrate, wherein the second nanowire has a length extending along a plane of the substrate, wherein first and second sides of the second nanowire are on first and second edges, respectively, along the length of the second nanowire; and a second pair of spacers comprising a first spacer adjacent to the first side of the second nanowire and to the substrate, and a second spacer adjacent to the second side of the second nanowire and to the substrate, wherein edges of the first spacer of the first nanowire are directly aligned over edges of the first spacer of the second nanowire, and wherein edges of the second spacer of the first nanowire are directly aligned over edges of the second spacer of the second nanowire.

Example 2. The apparatus of example 1 comprises a gate region disposed over the first and second nanowires.

Example 3. The apparatus of example 2 comprises a third pair of spacers comprising a first spacer adjacent to a first side of the gate region, and a second spacer adjacent to a second side of the gate region, wherein edges of the first spacer of the gate region is directly aligned over edges of the first spacers of the first and second nanowires, and wherein edges of the second spacer of the gate region are directly aligned over edges of the second spacers of the first and second nanowires.

Example 4. The apparatus of example 2, comprises: a source region adjacent to the first spacer of the third pair of spacers; and a drain region adjacent to the second spacer of the third pair of spacers.

Example 5. The apparatus of example 4, wherein crystal structure of the substrate directly under the second nanowire is different from crystal structure of the substrate near a backend.

Example 6. The apparatus of example 4, wherein the substrate directly under the second nanowire includes traces of Ge, Xe, or Ar, and wherein the substrate near a backend includes silicon only.

Example 7. The apparatus of example 4, comprises a first region adjacent to the source region and the substrate, and wherein the first region is directly adjacent to the first spacers of the first, second, and third pair of spacers.

Example 8. The apparatus of example 7, wherein the first region comprises one or more of: Si, Ge, C, In, Ga, As, or N.

Example 9. The apparatus of example 4, comprises a second region adjacent to the drain region and the substrate, and wherein the second region is directly adjacent to the second spacers of the first, second, and third pair of spacers.

Example 10. The apparatus of example 9, wherein the second region comprises one or more of: Si, Ge, C, In, Ga, As, or N.

Example 11. The apparatus according to any one of examples 1 to 10, wherein the first and second nanowires include one or more of: Si, Ge, Ga, As, In, N, or P.

Example 12. The apparatus according to any one of examples 1 to 11, wherein the first and second nanowires are separated by a region which comprises one or more of: Si, Ge, Gd, O, Hf, Si, Ta, Al, or N.

Example 13. A system comprising: a memory; a processor coupled to the memory, the processor including a device according to any one of examples 1 to 12; and a wireless interface to allow the processor to communicate with another device.

Example 14. A method comprising: forming a substrate; forming a first nanowire over the substrate; forming a second nanowire over the substrate; forming a gate over a portion of the first and second nanowires; implanting a dopant such that a region between the first and second nanowires under the gate does not receive the dopant while a region between the first and second nanowires away from the gate receives the dopant, wherein the dopant amorphize a material of the region between the first and second nanowires away from the gate; and isotropically etching of the region between the first and second nanowires away from the gate.

Example 15. The method of example 14 comprises burying spacers on either side of the first and second nanowires after isotropically etching the region.

Example 16. The method according to any one of examples 14 to 15, comprises depositing spacers on either side of the gate.

Example 17. The method according to any one of examples 14 to 16 comprises forming source and drain regions on either side of the spacers.

Example 18. The method according to any one of examples 14 to 17, wherein the first and second nanowires include one or more of: Si, Ge, Ga, As, In, N, or P.

Example 19. The method according to any one of examples 14 to 18, wherein crystal structure of the substrate directly under the second nanowire is different from crystal structure of the substrate near a backend.

Example 20. The method of example 16, wherein the substrate directly under the second nanowire includes traces of Ge, Xe, or Ar, and wherein the substrate near a backend includes silicon only.

Example 21. A method comprising: forming a substrate comprising silicon; forming a first nanowire over the substrate, wherein the first nanowire has a length extending along a plane of the substrate, wherein first and second sides of the first nanowire are on first and second edges, respectively, along the length of the first nanowire; forming a first pair of spacers comprising a first spacer adjacent to the first side of the first nanowire, and a second spacer adjacent to the second side of the first nanowire; forming a second nanowire over the substrate, wherein the second nanowire has a length extending along a plane of the substrate, wherein first and second sides of the second nanowire are on first and second edges, respectively, along the length of the second nanowire; and forming a second pair of spacers comprising a first spacer adjacent to the first side of the second nanowire and to the substrate, and a second spacer adjacent to the second side of the second nanowire and to the substrate, wherein edges of the first spacer of the first nanowire is directly aligned over edges of the first spacer of the second nanowire, and wherein edges of the second spacer of the first nanowire is directly aligned over edges of the second spacer of the second nanowire.

Example 22. The method of example 21 comprises a gate region disposed over the first and second nanowires.

Example 23. The method of example 22 comprises forming a third pair of spacers comprising a first spacer adjacent to a first side of the gate region, and a second spacer adjacent to a second side of the gate region, wherein edges of the first spacer of the gate region is directly aligned over edges of the first spacers of the first and second nanowires, and wherein edges of the second spacer of the gate region is directly aligned over edges of the second spacers of the first and second nanowires.

Example 24. The method of example 22, comprises forming a source region adjacent to the first spacer of the third pair of spacers; and forming a drain region adjacent to the second spacer of the third pair of spacers.

Example 25. The method of example 24, wherein crystal structure of the substrate directly under the second nanowire is different from crystal structure of the substrate near a backend.

Example 26. The method of example 24, wherein the substrate directly under the second nanowire includes traces of Ge, Xe, or Ar, and wherein the substrate near the backend includes silicon only.

Example 27. The method of example 24, comprises forming a first region adjacent to the source region and the substrate, and wherein the first region is directly adjacent to the first spacers of the first, second, and third pair of spacers.

Example 28. The method of example 27, wherein the first region comprises one or more of: Si, Ge, C, In, Ga, As, or N.

Example 29. The method of example 24, comprises forming a second region adjacent to the drain region and the substrate, and wherein the second region is directly adjacent to the second spacers of the first, second, and third pair of spacers.

Example 30. The method of example 29, wherein the second region comprises one or more of: Si, Ge, C, In, Ga, As, or N.

Example 31. The method according to any one of examples 21 to 30, wherein the first and second nanowires include one or more of: Si, Ge, Ga, As, In, N, or P.

Example 32. The method according to any one of examples 21 to 31, wherein the first and second nanowires are separated by a region which comprises one or more of: Gd, O, Hf, Si, Ta, Al, or N.

Example 33. An apparatus comprising: substrate means; a first nanowire means over the substrate means, wherein the first nanowire means has a length extending along a plane of the substrate means, wherein first and second sides of the first nanowire means are on first and second edges, respectively, along the length of the first nanowire means; a first pair of spacers means comprising a first spacer means adjacent to the first side of the first nanowire means, and a second spacer means adjacent to the second side of the first nanowire means; a second nanowire means disposed over the substrate means, wherein the second nanowire means has a length extending along a plane of the substrate means, wherein first and second sides of the second nanowire means are on first and second edges, respectively, along the length of the second nanowire means; and a second pair of spacers means comprising a first spacer means adjacent to the first side of the second nanowire means and to the substrate means, and a second spacer means adjacent to the second side of the second nanowire means and to the substrate means, wherein edges of the first spacer means of the first nanowire means are directly aligned over edges of the first spacer means of the second nanowire means, and wherein edges of the second spacer means of the first nanowire means are directly aligned over edges of the second spacer means of the second nanowire means.

Example 34. The apparatus of example 33 comprises a gate region disposed over the first and second nanowires means.

Example 35. The apparatus of example 34 comprises a third pair of spacers means comprising a first spacer means adjacent to a first side of the gate region, and a second spacer means adjacent to a second side of the gate region, wherein edges of the first spacer means of the gate region is directly aligned over edges of the first spacer means of the first and second nanowire means, and wherein edges of the second spacer means of the gate region are directly aligned over edges of the second spacer means of the first and second nanowire means.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
    a substrate comprising substantially crystalline silicon;
    a first nanowire over the substrate, wherein the first nanowire has a length extending along a plane of the substrate, wherein first and second sides of the first nanowire are on first and second edges, respectively, along the length of the first nanowire;
    a first pair of spacers comprising a first spacer adjacent to the first side of the first nanowire, and a second spacer adjacent to the second side of the first nanowire;
    a second nanowire over the substrate, wherein the second nanowire has a length extending along a plane of the substrate, wherein first and second sides of the second nanowire are on first and second edges, respectively, along the length of the second nanowire; and
    a second pair of spacers comprising a first spacer adjacent to the first side of the second nanowire and to the substrate, and a second spacer adjacent to the second side of the second nanowire and to the substrate,
    wherein edges of the first spacer of the first nanowire are directly aligned over edges of the first spacer of the second nanowire, wherein edges of the second spacer of the first nanowire are directly aligned over edges of the second spacer of the second nanowire, wherein a first region in the substrate proximal to the second nanowire comprises a modified silicon crystal structure relative to a silicon crystal structure of a second region in the substrate distal from the second nanowire, and wherein the first region comprises one of Ge, Xe, or Ar and the second region is absent Ge, Xe, and Ar.

2. The apparatus of claim 1, further comprising a gate region over the first and second nanowires.

3. The apparatus of claim 2, further comprising a third pair of spacers comprising a first spacer adjacent to a first side of the gate region, and a second spacer adjacent to a second side of the gate region, wherein edges of the first spacer of the gate region are directly aligned over edges of the first spacers of the first and second nanowires, and wherein edges of the second spacer of the gate region are directly aligned over edges of the second spacers of the first and second nanowires.

4. The apparatus of claim 2, further comprising:
    a source region adjacent to the first spacer of the third pair of spacers; and
    a drain region adjacent to the second spacer of the third pair of spacers.

5. The apparatus of claim 4, wherein the first region is directly under the second nanowire and the second region is near a backend of the substrate.

6. The apparatus of claim 4, further comprising a first third region adjacent to the source region and the substrate, and wherein the third region is directly adjacent to the first spacers of the first, second, and third pair of spacers.

7. The apparatus of claim 6, wherein the third region comprises one or more of: Si, Ge, C, In, Ga, As, or N.

8. The apparatus of claim 4, further comprising a third region adjacent to the drain region and the substrate, and wherein the third region is directly adjacent to the second spacers of the first, second, and third pair of spacers.

9. The apparatus of claim 8, wherein the third region comprises one or more of: Si, Ge, C, In, Ga, As, or N.

10. The apparatus of claim 1, wherein the first and second nanowires comprise one or more of: Si, Ge, Ga, As, In, N, or P.

11. The apparatus of claim 1, wherein the first and second nanowires are separated by a third region which comprises one or more of: Si, Ge, Gd, O, Hf, Si, Ta, Al, or N.

12. A system comprising:
    a memory;
    a processor coupled to the memory, the processor including a device which includes:
        a substrate comprising substantially crystalline silicon;
        a first nanowire over the substrate, wherein the first nanowire has a length extending along a plane of the substrate, wherein first and second sides of the first nanowire are on first and second edges, respectively, along the length of the first nanowire;
        a first pair of spacers comprising a first spacer adjacent to the first side of the first nanowire, and a second spacer adjacent to the second side of the first nanowire;
        a second nanowire over the substrate, wherein the second nanowire has a length extending along a plane of the substrate, wherein first and second sides of the second nanowire are on first and second edges, respectively, along the length of the second nanowire; and
        a second pair of spacers comprising a first spacer adjacent to the first side of the second nanowire and to the substrate, and a second spacer adjacent to the second side of the second nanowire and to the substrate,
        wherein edges of the first spacer of the first nanowire are directly aligned over edges of the first spacer of the second nanowire, wherein edges of the second spacer of the first nanowire are directly aligned over edges of the second spacer of the second nanowire, wherein a first region in the substrate proximal to the second nanowire comprises a modified silicon crystal structure relative to a silicon crystal structure of a second region in the substrate distal from the second nanowire, and wherein the first region comprises one of Ge, Xe, or Ar and the second region is absent Ge, Xe, and Ar; and a wireless interface to allow the processor to communicate with another device.

13. The system of claim 12, further comprising a gate region over the first and second nanowires.

14. The system of claim 13, further comprising a third pair of spacers comprising a first spacer adjacent to a first side of the gate region, and a second spacer adjacent to a second side of the gate region, wherein edges of the first spacer of the gate region are directly aligned over edges of the first spacers of the first and second nanowires, and wherein edges of the second spacer of the gate region are directly aligned over edges of the second spacers of the first and second nanowires.

15. A method comprising:

forming a first nanowire over a substrate;

forming a second nanowire over the substrate;

forming a gate over a portion of the first and second nanowires;

implanting a dopant such that a region between the first and second nanowires under the gate does not receive the dopant while a region between the first and second nanowires away from the gate receives the dopant, wherein the dopant amorphizes a material of the region between the first and second nanowires away from the gate; and isotopically etching of the region between the first and second nanowires away from the gate.

16. The method of claim 15, further comprising burying spacers on either side of the first and second nanowires after isotopically etching the region.

17. The method of claim 15, further comprising:

depositing spacers on either side of the gate; and forming source and drain regions on either side of the spacers.

18. The method of claim 15, wherein the first and second nanowires comprise one or more of: Si, Ge, Ga, As, In, N, or P.

19. The method of claim 15, wherein a crystal structure of the substrate directly under the second nanowire is different from a crystal structure of the substrate near a backend of the substrate, or wherein the substrate directly under the second nanowire includes traces of Ge, Xe, or Ar and the substrate near the backend comprises silicon.

* * * * *